(12) United States Patent
Ishii et al.

(10) Patent No.: US 12,120,836 B2
(45) Date of Patent: Oct. 15, 2024

(54) ELECTRICAL COMPONENT HOUSING

(71) Applicants: NISSAN MOTOR CO., LTD., Yokohama (JP); AMPERE S.A.S., Boulogne-Billancourt (FR)

(72) Inventors: Soichi Ishii, Kanagawa (JP); Rei Takahashi, Kanagawa (JP); Yasuyuki Kubota, Kanagawa (JP); Tadaaki Iiyama, Kanagawa (JP)

(73) Assignees: NISSAN MOTOR CO., LTD., Yokohama (JP); AMPERE S.A.S., Boulogne-Billancourt (FR)

(*) Notice: Subject to any disclaimer, the term of this patent is extended or adjusted under 35 U.S.C. 154(b) by 0 days.

(21) Appl. No.: 18/566,606

(22) PCT Filed: Jun. 8, 2021

(86) PCT No.: PCT/IB2021/000400
§ 371 (c)(1),
(2) Date: Dec. 1, 2023

(87) PCT Pub. No.: WO2022/259006
PCT Pub. Date: Dec. 15, 2022

(65) Prior Publication Data
US 2024/0268048 A1    Aug. 8, 2024

(51) Int. Cl.
*H05K 5/04* (2006.01)
*H05K 7/20* (2006.01)
*H05K 9/00* (2006.01)

(52) U.S. Cl.
CPC ........... *H05K 5/04* (2013.01); *H05K 7/20927* (2013.01); *H05K 9/0039* (2013.01)

(58) Field of Classification Search
CPC .. H05K 5/04; H05K 7/20927; H05K 7/20945; H05K 9/0039
See application file for complete search history.

(56) References Cited

U.S. PATENT DOCUMENTS 5,966,291 A * 10/1999 Baumel .............. H05K 7/20927
165/80.4
2013/0308257 A1   11/2013 Kosugi et al.
(Continued)

FOREIGN PATENT DOCUMENTS

CN    104298327 A    1/2015
CN    111313184 A    6/2020
(Continued)

*Primary Examiner* — Daniel J Rohrhoff
(74) *Attorney, Agent, or Firm* — Foley & Lardner LLP

(57) ABSTRACT

Provided is an electrical component housing for housing an electrical component. The electrical component housing includes a resin base portion allowing the electrical component to be mounted, a metal cover portion attached to the base portion and configured to cover the electrical component, a metal plate in contact with a bottom surface of the base portion in a manner of covering the bottom surface of the base portion. The electrical component housing also includes a conductive member provided in a through hole that penetrates the base portion in a thickness direction of the base portion, wherein the conductive member electrically connects a ground terminal of the electrical component and the metal plate.

6 Claims, 5 Drawing Sheets

(56) References Cited

U.S. PATENT DOCUMENTS

| | | | | |
|---|---|---|---|---|
| 2015/0029682 A1* | 1/2015 | Kadoya | ................ | H05K 9/0064 |
| | | | | 361/748 |
| 2020/0068749 A1* | 2/2020 | Ono | .................... | H05K 7/1407 |
| 2020/0185844 A1 | 6/2020 | Takahashi et al. | | |
| 2021/0029852 A1* | 1/2021 | Ono | ................... | H05K 7/20927 |
| 2021/0243922 A1 | 8/2021 | Takahashi et al. | | |
| 2022/0142014 A1* | 5/2022 | Ono | ........................ | H05K 5/04 |
| | | | | 361/699 |
| 2023/0292475 A1* | 9/2023 | Nakasaka | ............. | H02M 1/327 |
| 2023/0309275 A1* | 9/2023 | Daigo | ................ | H05K 7/20909 |
| 2024/0008207 A1* | 1/2024 | Takahashi | ................ | H05K 5/04 |

FOREIGN PATENT DOCUMENTS

| | | | | |
|---|---|---|---|---|
| CN | 211831654 U | 10/2020 | | |
| CN | 112534701 A | 3/2021 | | |
| JP | H10-178151 A | 6/1998 | | |
| JP | 2011-233726 A | 11/2011 | | |
| JP | 2016-059242 A | 4/2016 | | |
| WO | WO-2012/124074 A1 | 9/2012 | | |
| WO | WO-2019175928 A1 * | 9/2019 | .......... | H05K 7/1432 |

\* cited by examiner

ELECTRICAL COMPONENT HOUSING

TECHNICAL FIELD

The present invention relates to an electrical component housing.

BACKGROUND ART

WO2019/175928 discloses an electronic component housing that houses an electronic component inside. In this electronic component housing, a portion where the electronic component is mounted is made of a resin material that is easy to process and is lightweight, and a portion that covers the electronic component is made of a metal material.

SUMMARY OF INVENTION

In a housing that houses an electrical (electronic) component inside, in order to reduce influence of electromagnetic noise from outside of the housing and influence of electromagnetic noise to outside of the housing, it is necessary to earth-connect (electrically connect) a ground terminal of the electrical component in the housing to a metal portion of the housing. However, in a housing in which a portion where an electrical component is mounted is made of a resin material, in order to earth-connect the electrical component, it is necessary to assemble the housing with a ground terminal of the electrical component connected to an inner wall of a metal portion by an earth wire, which makes the assembly work difficult.

In view of the above problem, an object of the present invention is to provide an electrical component housing that is easy to assemble.

According to an aspect of this invention, there is provided an electrical component housing for housing an electrical component. The electrical component housing includes a resin base portion allowing the electrical component to be mounted, a metal cover portion attached to the base portion and configured to cover the electrical component, a metal plate in contact with a bottom surface of the base portion in a manner of covering the bottom surface of the base portion. The electrical component housing also includes a conductive member provided in a through hole that penetrates the base portion in a thickness direction of the base portion, wherein the conductive member electrically connects a ground terminal of the electrical component and the metal plate.

DESCRIPTION OF EMBODIMENTS

Hereinafter, embodiments of the present invention will be described with reference to the drawings and the like.

First Embodiment

An electrical component housing 100 according to the first embodiment of the present invention will be described with reference to FIG. 1.

Figure 1:
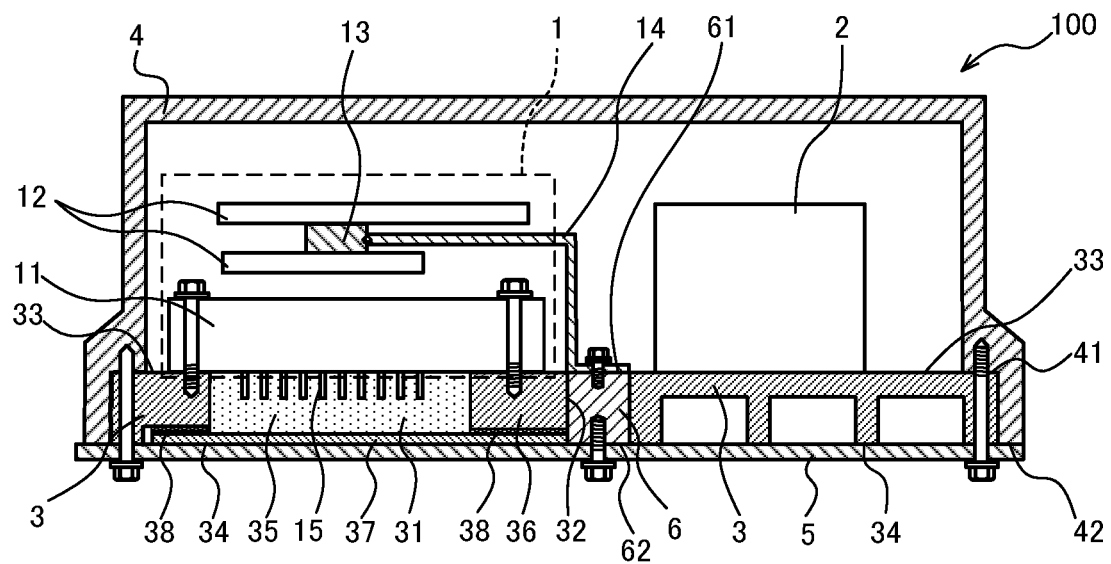
FIG. 1 is a schematic cross-sectional view of an electrical component housing according to a first embodiment.

FIG. 1 is a schematic cross-sectional view of the electrical component housing 100 according to the first embodiment, and is a cross-sectional side view of the electrical component housing 100.

The electrical component housing 100 is a housing that houses electrical components such as an inverter 1 and a smoothing capacitor 2. The electrical component housing 100 includes a resin base portion 3 where the inverter 1 and the smoothing capacitor 2 are mounted, a metal cover portion 4 attached to the base portion 3 in a manner of covering the inverter 1 and the smoothing capacitor 2, and a metal plate 5 in contact with a bottom surface 34 of the base portion 3 in a manner of covering the bottom surface 34 of the base portion 3. The base portion 3 is formed with a coolant channel 31 passing below a position where the inverter 1 is mounted, and a through hole 32 in which a conductive member 6 is provided.

The inverter 1 housed in the electrical component housing 100 includes a power module 11 with a built-in semiconductor element, a control board 12 including a control circuit, and the like, and has a function of converting electric power into direct current or alternating current. The inverter 1 is fixed to the base portion 3 of the electrical component housing 100 with bolts or the like. The inverter 1 also includes a ground terminal 13, and the ground terminal 13 is electrically connected to the conductive member 6 via a busbar (conductor) 14.

The smoothing capacitor 2 housed in the electrical component housing 100 houses a capacitor element in a capacitor case, and is fixed to the base portion 3 with bolts (not shown) or the like.

The base portion 3 is made of an electrically insulating resin material such as polyphenylene sulfide (PPS) or polyphthalamide (PPA) as a plate member, and includes a mounting surface 33 where the inverter 1 and the smoothing capacitor 2 are mounted. By making the base portion 3 with a resin material, weight and cost of the electrical component housing 100 can be reduced, and workability thereof can be improved. The metal plate 5 made of iron, aluminum, or the like, which is larger than an outer shape of the bottom surface 34, is in contact with the bottom surface 34 of the base portion 3. That is, the bottom surface 34 of the base portion 3 is covered with the metal plate 5.

The base portion 3 includes a first member (base body) 36 having an opening 35 for forming the coolant channel 31 and a second member (resin plate) 37. The opening 35 of the first member 36 opens downward, and the second member 37 is welded (bonded) to the first member 36 in a manner of covering the opening 35. In this way, a space formed by sealing the opening 35 with the second member 37 serves as the coolant channel 31. A joint portion 38 between the first member 36 and the second member 37 is formed along the coolant channel 31 around the coolant channel 31. Note that in FIG. 1, although an upper portion of the first member 36 is also opened, and the opening on the upper portion is covered with the inverter 1, the present invention is not necessarily limited thereto, and the upper portion of the first member 36 may be closed.

The coolant channel 31 passes below the position where the inverter 1 is mounted in the base portion 3, and cooling water for cooling the inverter 1 flows in the coolant channel 31. Fins 15 are provided below the inverter 1, and the fins 15 are in contact with the cooling water flowing through the coolant channel 31. As a result, the inverter 1 is efficiently cooled. Note that the inverter 1 may be fixed to the base portion 3 via a substrate having a plurality of holes through which the fins 15 pass or the like. Although it is preferable that the inverter 1 is provided with the fins 15 to be brought into contact with the cooling water, the present invention is not necessarily limited thereto, and the fins 15 may not be provided.

The base portion 3 includes the through hole 32 penetrating through the base portion 3 in a thickness direction of the base portion 3, and the conductive member 6 electrically connected to the ground terminal 13 of the inverter 1 is provided in the through hole 32. Note that details of installation of the conductive member 6 will be described later.

The cover portion 4 is made of a metal material such as aluminum, and is attached to the base portion 3 in a manner of covering the periphery of the inverter 1 and the smoothing capacitor 2. The cover portion 4 is formed with a stepped portion 41 including an end surface that is in contact with the mounting surface 33 of the base portion 3 at an inner portion of a side wall, and a tip surface 42 of the side wall is in contact with an outer peripheral edge of the metal plate 5 that is in contact with the bottom surface 34 of the base portion 3. The cover portion 4, the base portion 3 and the metal plate 5 are fastened together by bolts or the like from outside of the metal plate 5 at a portion where the stepped portion 41 of the cover portion 4 and the mounting surface 33 of the base portion 3 are in contact with each other. By completely covering the inverter 1 and the smoothing capacitor 2 with the metal cover portion 4 and the metal plate 5 in this manner, electromagnetic shielding performance of the electrical component housing 100 can be enhanced.

In the electrical component housing 100 configured as described above, by making the base portion 3 of resin, weight reduction, cost reduction, and improvement in workability are achieved, and by covering the periphery thereof by the cover portion 4 made of metal and the metal plate 5, the electromagnetic shielding performance is enhanced.

In a housing that houses an electrical (electronic) component inside, in order to reduce influence of electromagnetic noise from outside of the housing and influence of electromagnetic noise to outside of the housing, it is necessary to earth-connect (electrically connect) a ground terminal of the electrical component in the housing to a metal portion of the housing. However, in a housing in which a base portion where an electrical component is mounted is made of a resin material, in order to earth-connect a ground terminal of the electrical component to a metal portion using an earth wire or the like, it is necessary to assemble the housing with the earth wire connected to an inner wall of the metal portion, which makes the assembly work difficult. For example, in the present embodiment, it is difficult to assemble the electrical component housing 100 in a state where the ground terminal 13 of the inverter 1 and the metal cover portion 4 are connected by an earth wire or the like. In order to enable the assembly work, it is necessary to increase a harness length of the earth wire, but when the harness length of the earth wire increases, inductance of the earth wire increases, and there is a risk that performance related to electromagnetic noise reduction (EMC performance) will deteriorate.

Therefore, in the present embodiment, the through hole 32 is provided in the base portion 3 of the electrical component housing 100 in a manner of penetrating the base portion 3 in the thickness direction, and the conductive member 6 that electrically connect the ground terminal 13 of the inverter (electrical component) 1 and the metal plate 5 is provided in the through hole 32. By providing the conductive member 6 in the through hole 32 of the base portion 3, in assembly of the electrical component housing 100, the ground terminal 13 of the inverter (electrical component) 1 can be in earth connection simply by fastening (abutting) the metal plate 5 and the conductive member 6 while the ground terminal 13 and the conductive member 6 are connected to each other. Therefore, it is not necessary to assemble the electrical component housing 100 in a state where the earth wire or the like is connected to the inner wall of the metal portion (cover portion 4) of the electrical component housing 100, thereby improving assembling workability. Since it is not necessary to increase the harness length of the earth wire for the assembly work, it is possible to suppress the deterioration of the EMC performance.

Details of methods for installing the conductive member 6 and assembling the electrical component housing 100 will be described below.

As shown in FIG. 1, the base portion 3 of the electrical component housing 100 is formed with the through hole 32 penetrating through the base portion 3 in the thickness direction of the base portion 3, and the conductive member 6 made of metal such as aluminum is provided in the through hole 32. A seal member (not shown) seals between the conductive member 6 and an inner peripheral surface of the through hole 32. The busbar 14 connected to the ground terminal 13 of the inverter 1 is fixed to an upper surface 61 of the conductive member 6 with bolts or the like. On the other hand, the bottom surface 62 of the conductive member 6 is in contact with an upper surface of the metal plate 5 covering the bottom surface 34 of the base portion 3, and the metal plate 5 is fixed to the bottom surface 62 of the conductive member 6 by bolts or the like from the metal plate 5 side. In this way, the ground terminal 13 of the inverter 1 and the metal plate 5 are electrically connected via the conductive member 6.

Note that the through hole 32 is preferably formed at a position as close to the inverter 1 as possible. In this way, a distance between the ground terminal 13 of the inverter 1 and the conductive member 6 can be shortened, and a length of the busbar 14 can be reduced.

When assembling the electrical component housing 100, first, the busbar 14, which is connected to the ground terminal 13 of the inverter 1, is connected (fixed) to the conductive member 6 with bolts or the like. Next, the cover portion 4, the base portion 3 and the metal plate 5 are fastened together, and the metal plate 5 and the conductive member 6 are fastened with bolts or the like from the metal plate 5 side so that the metal plate 5 is in contact with the bottom surface 62 of the conductive member 6. In this way, since the inverter 1 is earth-connected by fastening the metal plate 5 to the conductive member 6, it is not necessary to assemble the electrical component housing 100 with the earth wire connected to the inner wall of the cover portion 4 and the metal plate 5. Therefore, ease of assembly of the electrical component housing 100 is improved.

According to the electrical component housing 100 according to the first embodiment described above, the following effects can be obtained. The electrical component housing 100 includes the resin base portion 3 where the inverter 1 and the smoothing capacitor 2 (electrical component) are mounted, the metal cover portion 4 attached to the base portion 3 in a manner of covering the inverter 1 and the smoothing capacitor 2 (electrical component). The electrical component housing 100 also includes the metal plate 5 in contact with the bottom surface 34 of the base portion 3 in a manner of covering the bottom surface 34 of the base portion 3, and the conductive member 6 provided in the through hole 32 penetrating the base portion 3 in the thickness direction of the base portion 3. The conductive member 6 electrically connects the ground terminal 13 of the inverter 1 (electrical component) and the metal plate 5. In this way, since the conductive member 6 electrically connected to the ground terminal 13 is provided on the base portion 3, when the electrical component housing 100 is assembled, the ground terminal 13 of the inverter 1 (electrical component) is earth-connected simply by bringing the metal plate 5 and the conductive member 6 come into contact with each other. Therefore, it is not necessary to assemble the electrical component housing 100 in a state where the earth wire or the like is connected to the inner wall of the cover portion 4 (metal portion) of the electrical component housing 100, thereby improving assembling workability.

When assembling the electrical component housing 100, the ground terminal 13 of the inverter 1 (electrical component) is earth-connected simply by bringing the metal plate 5 and the conductive member 6 into contact with each other, and therefore, there is no need to increase the harness length of the earth wire. Therefore, deterioration of EMC performance can be suppressed.

In the electrical component housing 100, the base portion 3 includes the coolant channel 31 through which the cooling water (coolant) for cooling the inverter 1 (electrical component) flows, and the coolant channel 31 passes below the position where the inverter 1 (electrical component) is mounted. As a result, the inverter 1 (electrical component) is efficiently cooled.

Note that although it is preferable to provide the coolant channel 31 for cooling the inverter 1 on the base portion 3 as in the present embodiment, the coolant channel 31 is not an essential component. That is, even if the coolant channel 31 is not provided, it is possible to obtain the effect of improving the assembling workability.

In the present embodiment, the coolant channel 31 is configured to pass below the position where the inverter 1 is mounted, but the coolant channel 31 may also be formed in a manner of passing below the position where the smoothing capacitor 2 is mounted.

In the present embodiment, although the coolant channel 31 is formed by welding the second member 37 to the first member 36 in a manner of covering the opening 35, the method for joining the second member 37 and the first member 36 is not limited to welding, and any known method may be used. For example, a gasket seal may be used for joining.

Second Embodiment

The electrical component housing 100 according to the second embodiment will be described with reference to FIG. 2. Note that the same elements as those in the first embodiment are denoted by the same reference numerals, and the description thereof will be omitted.

Figure 2:
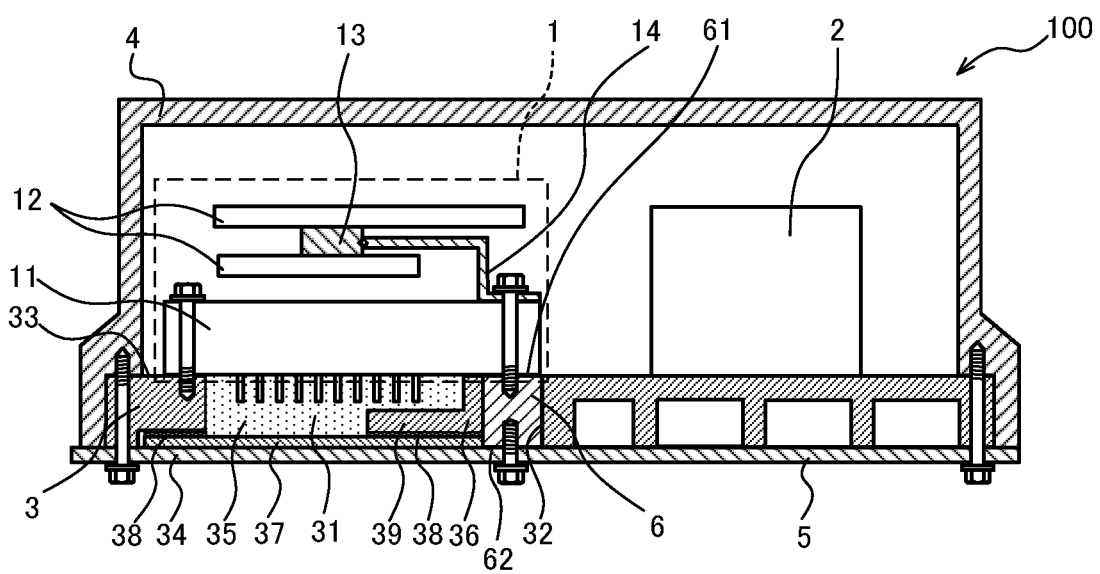
FIG. 2 is a schematic cross-sectional view of an electrical component housing according to a second embodiment.

FIG. 2 is a schematic cross-sectional view of the electrical component housing 100 according to the second embodiment. As shown in FIG. 2, in the present embodiment, the shape of the coolant channel 31 is different from that in the first embodiment.

As shown in FIG. 2, although the coolant channel 31 is formed on the base portion 3 in the present embodiment, the coolant channel 31 below the inverter 1 is formed with a protruding portion 39 protruding from an inner peripheral surface of the opening 35 toward a center in a width direction of the coolant channel 31. That is, the first member (base body) 36 of the base portion 3 includes a portion extending below the position where the inverter 1 is mounted so that the protruding portion 39 is formed. A joint portion 38 where the first member 36 and the second member (resin plate) 37 are welded (joined) is formed on a lower surface of the protruding portion 39.

As shown in FIG. 2, the conductive member 6 provided in the through hole 32 of the base portion 3 is installed near the protruding portion 39 and directly below the inverter 1, and the upper surface 61 is in contact with the bottom surface of the inverter 1. The busbar 14 connected to the ground terminal 13 of the inverter 1 is in contact with the inverter 1 above a position where the conductive member 6 and the inverter 1 are in contact with each other, and at this position, the busbar 14, the power module 11 of the inverter 1, and the conductive member 6 are fastened together from the busbar 14 side with bolts or the like. On the other hand, the bottom surface 62 of the conductive member 6 is fastened to the metal plate 5 covering the bottom surface 34 of the base portion 3 with bolts or the like. In this way, the ground terminal 13 and the metal plate 5 are electrically connected via the conductive member 6.

Here, if the conductive member 6 (through hole 32) is provided at a position where the joint portion 38 is present, since sealing performance of the coolant channel 31 is deteriorated, the conductive member 6 needs to be installed while avoiding the joint portion 38. Therefore, when the coolant channel 31 does not include the protruding portion 39, the conductive member 6 must be provided at a position away from the coolant channel 31 and avoiding the joint portion 38 around the coolant channel 31. On the other hand, in the present embodiment, in the coolant channel 31 below the inverter 1, the protruding portion 39 is formed that protrudes from the inner peripheral surface of the opening 35 toward the center of the coolant channel 31 in the width direction, and the joint portion 38 is formed on the lower surface of the protruding portion 39. Since the joint portion 38 is formed on the lower surface of the protruding portion 39 in this way, the conductive member 6 can be installed near the protruding portion 39, that is, near the coolant channel 31 below the inverter 1. Therefore, the distance between the inverter 1 and the conductive member 6 can be shortened. As a result, the busbar 14 connecting the ground terminal 13 of the inverter 1 and the conductive member 6 can be shortened, so that an inductance of the busbar 14 is reduced and the EMC performance is improved.

Since the conductive member 6 can be installed near the coolant channel 31 below the inverter 1, the conductive member 6 can be installed directly below the inverter 1 as shown in FIG. 2. As described above, in the present embodiment, the conductive member 6 is installed directly below the inverter 1, and the ground terminal 13 (the busbar 14 connected thereto), the power module 11 of the inverter 1, and the conductive member 6 are fastened together with bolts or the like. That is, a fixing member (bolts or the like) for fixing the inverter 1 to the base portion 3 and a fixing member (bolts or the like) for fixing the busbar 14 (conductor) connected to the ground terminal 13 to the conductive member 6 are not separately provided. Therefore, the number of parts is reduced, and the earth connection of the inverter 1 (electrical component) can be achieved compactly and inexpensively.

According to the electrical component housing 100 according to the second embodiment described above, the following effects can be obtained. In the electrical component housing 100, in the coolant channel 31 below the inverter 1 (electrical component), the protruding portion 39 is formed that protrudes from the inner peripheral surface of the opening 35 toward the center of the coolant channel 31 in the width direction, and the joint portion 38 is formed on the lower surface of the protruding portion 39. The conductive member 6 is provided in near the protruding portion 39. In this way, the joint portion 38 is formed on the lower surface of the protruding portion 39, and the conductive member 6 is installed near the protruding portion 39, that is, near the coolant channel 31 below the inverter 1. As a result, the busbar (conductor) 14 connecting the inverter 1 and the conductive member 6 can be shortened, and the inductance of the busbar (conductor) 14 is reduced, and the EMC performance is improved.

In the electrical component housing 100, the conductive member 6 is integrated and fastened with the inverter 1 (electrical component) and the busbar 14 (conductor) connected to the ground terminal 13 of the inverter 1 (electrical component) directly below the inverter 1 (electrical component). That is, a fixing member (bolts or the like) for fixing the inverter 1 (electrical component) to the base portion 3 and a fixing member (bolts or the like) for fixing the busbar 14 (conductor) connected to the ground terminal 13 to the conductive member 6 are not separately provided. Therefore, the number of parts is reduced, and the earth connection of the inverter 1 (electrical component) can be achieved compactly and inexpensively.

Note that although it is preferable to install the conductive member 6 directly below the inverter 1 as in the present embodiment, the installation position of the conductive member 6 is not necessarily limited thereto, and may be any position near the protruding portion 39. When the conductive member 6 is installed near the protruding portion 39, the distance between the inverter 1 and the conductive member 6 can be shortened, and the EMC performance is improved.

Third Embodiment

The electrical component housing 100 according to the third embodiment will be described with reference to FIG. 3. The same elements as those in the other embodiments are denoted by the same reference numerals, and description thereof will be omitted.

Figure 3:
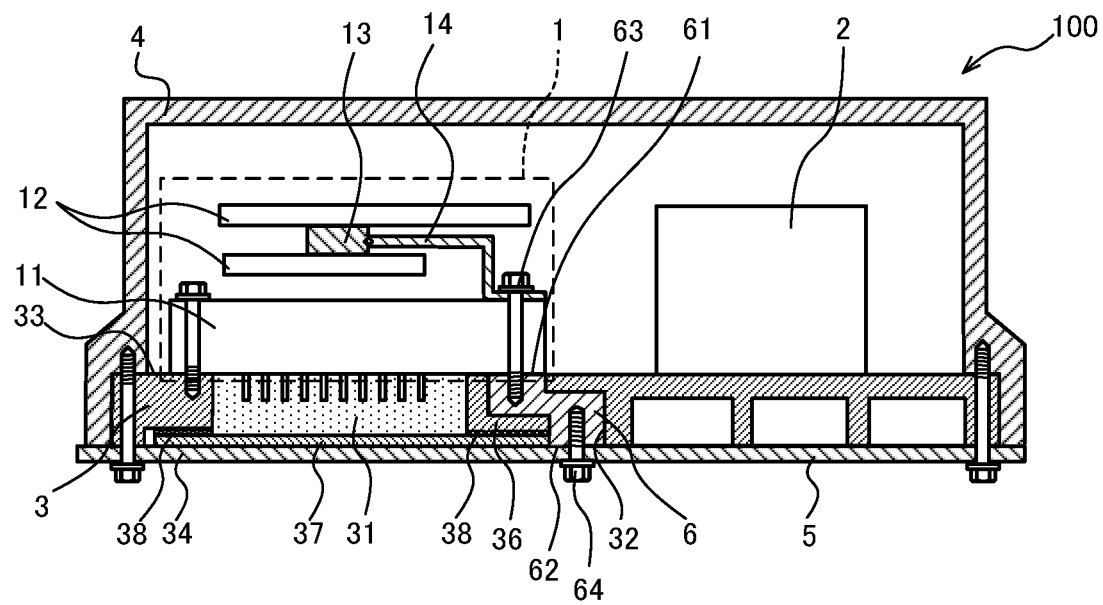
FIG. 3 is a schematic cross-sectional view of an electrical component housing according to a third embodiment.

FIG. 3 is a schematic cross-sectional view of the electrical component housing 100 according to the third embodiment. As shown in FIG. 3, in the present embodiment, the shape of the conductive member 6 is different from those of the other embodiments.

As shown in FIG. 3, the coolant channel 31 is also formed on the base portion 3 in the present embodiment. The joint portion 38 between the first member 36 and the second member 37 is formed along the coolant channel 31 around the coolant channel 31.

Here, as described above, if the conductive member 6 is provided at a position where the joint portion 38 is present, the sealing performance of the coolant channel 31 is deteriorated, and thus the conductive member 6 needs to be installed avoiding the joint portion 38. On the other hand, if the conductive member 6 is provided at a position away from the coolant channel 31 below the inverter 1 in order to avoid the joint portion 38, the length of the busbar 14 connecting the inverter 1 and the conductive member 6 may increase, and the EMC performance may deteriorate. Therefore, in the present embodiment, the conductive member 6 is bent in a crank shape so as to avoid the joint portion 38. In this way, the conductive member 6 can be installed near the coolant channel 31 below the inverter 1, and the distance between the inverter 1 and the conductive member 6 can be shortened. Therefore, the busbar 14 connecting the inverter 1 and the conductive member 6 can be shortened, and the inductance of the busbar 14 is reduced, and the EMC performance is improved.

Details of the shape of the conductive member 6 in the electrical component housing 100 according to the present embodiment will be described below.

As shown in FIG. 3, the conductive member 6 is provided near the coolant channel 31 below the inverter 1. The upper surface 61 of the conductive member 6 is positioned directly below the inverter 1 and is in contact with the bottom surface of the inverter 1. The busbar 14 connected to the ground terminal 13 of the inverter 1 is in contact with the inverter 1 above the position where the conductive member 6 and the inverter 1 are in contact with each other, and at this position, the busbar 14, the power module 11 of the inverter 1, and the conductive member 6 are fastened together from the busbar 14 side with bolts 63 or the like. The through hole 32 of the base portion 3 and the conductive member 6 in the through hole 32 are bent in a direction away from the coolant channel 31 at upper portions thereof, and bent downward at a position outside the position where the joint portion 38 is present. That is, the conductive member 6 is bent in a crank shape near the coolant channel 31 below the inverter 1 so as to avoid the joint portion 38. The bottom surface 62 of the conductive member 6 is in contact with the upper surface of the metal plate 5 and is fixed to the metal plate 5 with bolts 64 or the like. Note that the bolts 63 and 64 overlap each other in a height (up-down) direction of the electrical component housing 100.

Since the conductive member 6 is provided near the coolant channel 31 below the inverter 1 in such a shape for avoiding the joint portion 38, the distance between the inverter 1 and the conductive member 6 can be shortened. Since the conductive member 6 is bent in a crank shape, the bolts 63 for fixing the busbar 14 and the upper surface 61 of the conductive member 6 and the bolts 64 for fixing the bottom surface 62 of the conductive member 6 and the metal plate 5 can be provided in a manner of overlapping each other in the height (up-down) direction of the electrical component housing 100. As a result, the heights of the conductive member 6 and the base portion 3 can be reduced, resulting in further space saving and cost reduction. Furthermore, the conductive member 6 is installed directly below the inverter 1, and the ground terminal 13 (the busbar 14 connected thereto), the inverter 1, and the conductive member 6 are integrated and fastened together. Therefore, it is not necessary to separately provide the fixing member (bolts or the like) for fixing the inverter 1 (electrical component) to the base portion 3 and the fixing member (bolts or the like) for fixing the busbar 14 (conductor) connected to the ground terminal 13 to the conductive member 6, and the number of parts is reduced. Therefore, the earth connection of the inverter 1 (electrical component) can be achieved more compactly and inexpensively.

According to the electrical component housing 100 according to the third embodiment described above, the following effects can be obtained.

In the electrical component housing 100, the conductive member 6 is bent in a crank shape near the coolant channel 31 below the inverter 1 (electrical component) so as to avoid the joint portion 38. Since the conductive member 6 is provided near the coolant channel 31 below the inverter 1 in such a shape for avoiding the joint portion 38, the distance between the inverter 1 (electrical component) and the conductive member 6 can be shortened. Therefore, the busbar 14 (conductor) connecting the inverter 1 (electrical component) and the conductive member 6 can be shortened, and the inductance thereof is reduced, and the EMC performance is improved.

Since the conductive member 6 is bent in a crank shape, the bolts 63 (fixing member) for fixing the busbar 14 and the upper surface 61 of the conductive member 6 and the bolts 64 (fixing member) for fixing the bottom surface 62 of the conductive member 6 and the metal plate 5 can be provided in a manner of overlapping each other in the height (up-down) direction of the electrical component housing 100. As a result, the heights of the conductive member 6 and the base portion 3 can be reduced, resulting in further space saving and cost reduction.

In the electrical component housing 100, the conductive member 6 is integrated and fastened with the inverter 1 (electrical component) and the busbar 14 (conductor) connected to the ground terminal 13 of the inverter 1 (electrical component) directly below the inverter 1 (electrical component). That is, the fixing member (bolts or the like) for fixing the inverter 1 (electrical component) to the base portion 3 and the fixing member (bolts or the like) for fixing the busbar 14 (conductor) connected to the ground terminal 13 to the conductive member 6 are not separately provided. Therefore, the number of parts is reduced, and the earth connection of the inverter 1 (electrical component) can be achieved more compactly and inexpensively.

Note that although it is preferable to install the conductive member 6 directly below the inverter 1 as in the present embodiment, the installation position of the conductive member 6 is not necessarily limited thereto, and may be any position near the coolant channel 31 below the inverter 1. When the conductive member 6 is installed near the coolant channel 31 below the inverter 1, the distance between the inverter 1 and the conductive member 6 can be shortened, and the EMC performance is improved.

Fourth Embodiment

The electrical component housing 100 according to the fourth embodiment will be described with reference to FIGS. 4 and 5. The same elements as those in the other embodiments are denoted by the same reference numerals, and description thereof will be omitted.

Figure 4:
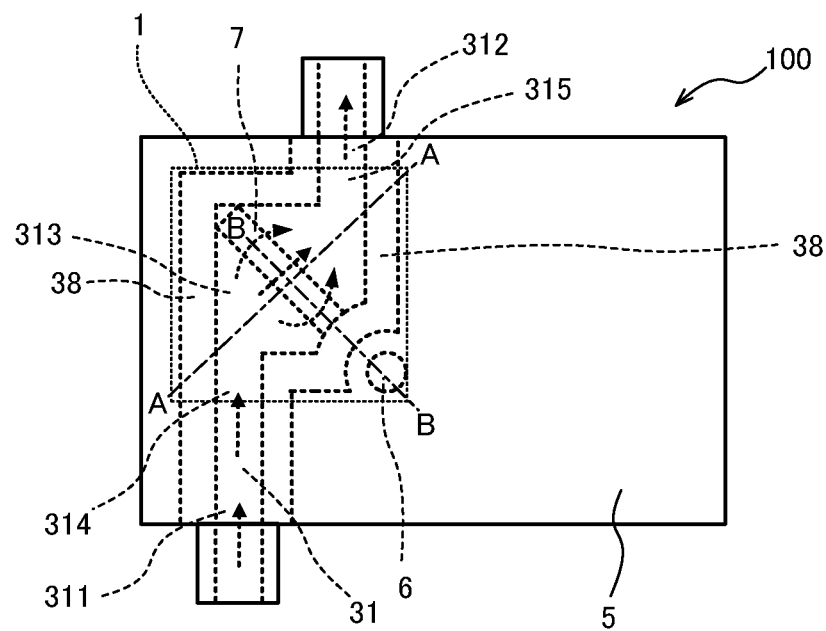
FIG. 4 is a bottom view of an electrical component housing according to a fourth embodiment.
Figure 5A:
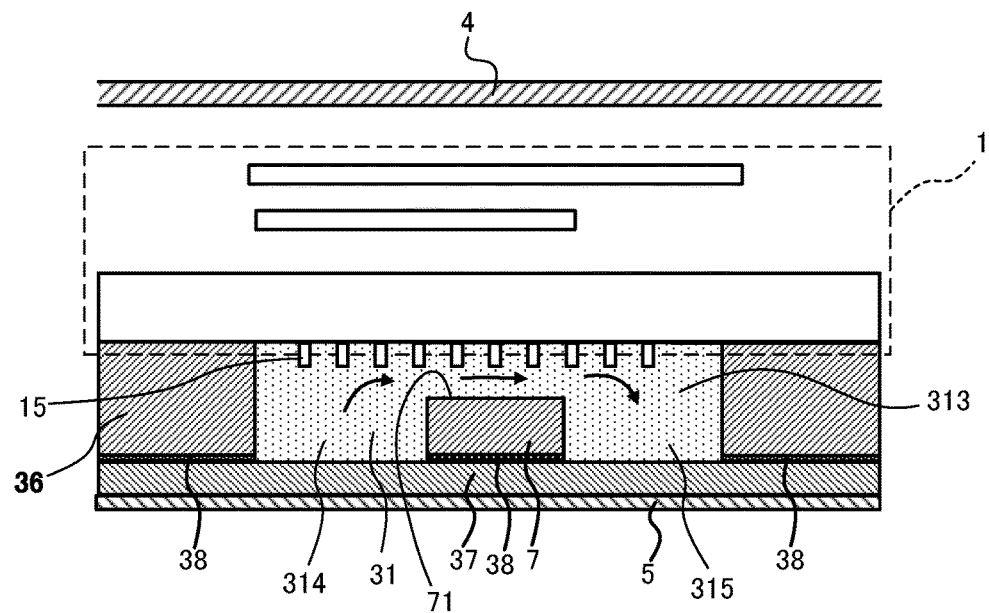
FIG. 5A is a cross-sectional view taken along a line A-A in FIG. 4.
Figure 5B:
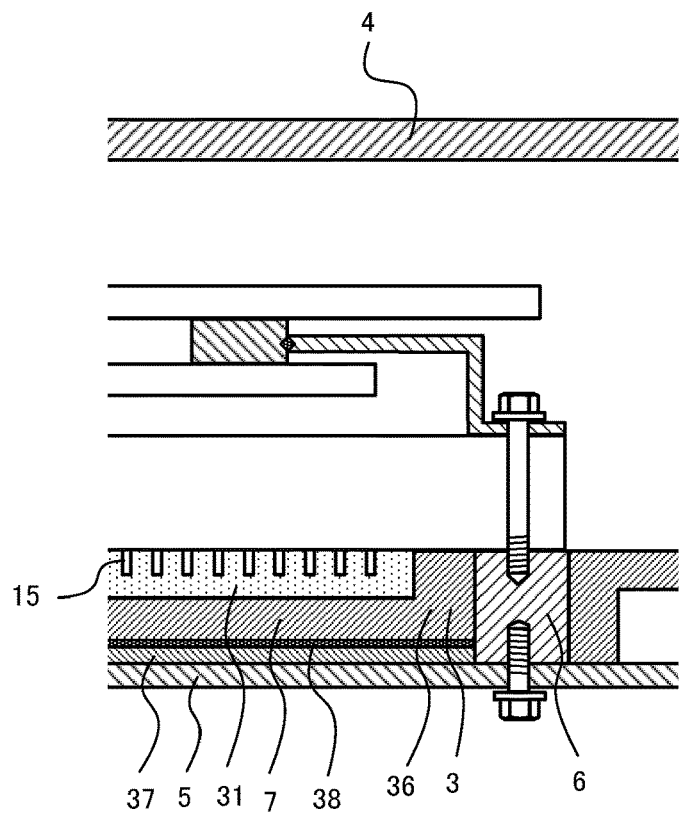
FIG. 5B is a cross-sectional view taken along a line B-B in FIG. 4.

FIG. 4 is a bottom view of the electrical component housing 100 according to the fourth embodiment, and FIG. 5A is a cross-sectional view along a line A-A in FIG. 4, and FIG. 5B is a cross-sectional view along a line B-B in FIG. 4. The present embodiment differs from the other embodiments in that a reinforcing member 7 is provided in the coolant channel 31.

As shown in FIG. 4, the coolant channel 31 includes a channel inlet 311 through which the cooling water flows into the electrical component housing 100, and a channel outlet 312 through which the cooling water that cools the inverter 1 flows out of the electrical component housing 100. The coolant channel 31 includes a rectangular portion 313 formed between the channel inlet 311 and the channel outlet 312 and having a channel width wider than that of other portions and having a substantially rectangular shape in a top (bottom) view. The inverter 1 is mounted on the base portion 3 above the rectangular portion 313. The joint portion 38 is formed along the coolant channel 31 around the coolant channel 31.

Of four corner portions of the rectangular portion 313, a corner portion that is closest to the center of the electrical component housing 100 is recessed toward the inside of the coolant channel 31. The conductive member 6 is installed in this recessed portion. Accordingly, the conductive member 6 can be disposed directly below the inverter 1 above the rectangular portion 313, and the distance between the conductive member 6 and the inverter 1 can be shortened. Therefore, the length of the busbar 14 connecting the inverter 1 and the conductive member 6 can be shortened, and the inductance of the busbar 14 is reduced, and the EMC performance is improved. Since the conductive member 6 is disposed inside the inverter 1 (immediately below the inverter 1) in a top view, space is further reduced.

In the rectangular portion 313, the reinforcing member 7 for ensuring rigidity of the base portion 3 is provided across the coolant channel 31 and on a diagonal line connecting the corner portion that is closest to the center of the electrical component housing 100 and a corner portion opposite thereto. On the other hand, at the two corner portions on a diagonal line orthogonal to the diagonal line on which the reinforcing member 7 is disposed, a rectangular portion inlet 314 through which the cooling water flows into the rectangular portion 313 and a rectangular portion outlet 315 through which the cooling water flows out from the rectangular portion 313 are formed, respectively. Note that as shown in FIG. 4, the rectangular portion inlet 314 and the rectangular portion outlet 315 are formed so that the channel width of the coolant channel 31 is narrower than that inside the rectangular portion 313.

As shown in FIGS. 5A and 5B, the cooling water inside the rectangular portion 313 is in contact with the fins 15 of the inverter 1. The reinforcing member 7 in the rectangular portion 313 constitutes a part of the first member (base body) 36 and extends upward from the bottom surface of the coolant channel 31 (that is, the upper surface of the second member (resin plate)). Preferably, the bottom surface of the reinforcing member 7 is in contact with the upper surface of the second member (resin plate) 37, and the reinforcing member 7 and the second member 37 are joined by welding or the like at the joint portion 38 where the bottom surface of the reinforcing member 7 and the second member are in contact with each other. By joining the reinforcing member 7 to the second member 37 in this manner, the rigidity of the base portion 3 is further strengthened. The reinforcing member 7 is configured to be lower than the coolant channel 31. Therefore, the cooling water in the coolant channel 31 flows through a tip 71 of the reinforcing member 7. That is, as indicated by arrows in FIG. 5A, the cooling water in the coolant channel 31 first flows from the rectangular portion inlet 314 toward the tip 71 of the reinforcing member 7 (above the coolant channel 31), and then flows from the tip 71 of the reinforcing member 7 toward the rectangular portion outlet 315. As a result, the cooling water in the coolant channel 31 (rectangular portion 313) is prevented from being biased downward, and the cooling water flows evenly along the fins 15 of the inverter 1. Therefore, cooling efficiency of the inverter 1 is increased.

Since the rectangular portion inlet 314 and the rectangular portion outlet 315 are formed to have a narrower channel width of the coolant channel 31 than in the rectangular portion 313, a flow rate of the cooling water in the rectangular portion 313 increases, and the cooling efficiency of the inverter 1 is further increased.

Note that in the present embodiment, the reinforcing member 7 is configured as a part of the first member (base body) 36, but the present invention is not limited thereto, and the reinforcing member 7 may be provided as a separate member from the first member 36 for example.

According to the electrical component housing 100 according to the fourth embodiment described above, the following effects can be obtained.

The electrical component housing 100 includes the fins 15 that allow the inverter 1 (electrical component) to come into contact with the cooling water in the coolant channel 31. The reinforcing member 7 that crosses the coolant channel 31 is erected from the second member (resin plate) 37 in the coolant channel 31 below the inverter 1 (electrical component), and the reinforcing member 7 is configured to be lower than the coolant channel 31 so that the cooling water passes through the tip 71 of the reinforcing member 7. As a result, the cooling water in the coolant channel 31 is prevented from being biased downward, and the cooling water flows evenly along the fins 15 of the inverter 1. Therefore, the cooling efficiency of the inverter 1 is increased.

Note that it is preferable to provide the coolant channel 31 with the rectangular portion 313 having a wider channel width than other portions to increase the flow rate in the rectangular portion 313 as in the present embodiment, but the rectangular portion 313 may not necessarily be provided. When the reinforcing member 7 across the coolant channel 31 is provided in the coolant channel 31 below the inverter 1, biasing of the cooling water is suppressed and the cooling efficiency of the inverter 1 is increased.

Fifth Embodiment

The electrical component housing 100 according to the fifth embodiment will be described with reference to FIGS. 6 to 9. The same elements as those in the other embodiments are denoted by the same reference numerals, and description thereof will be omitted.

Figure 6:
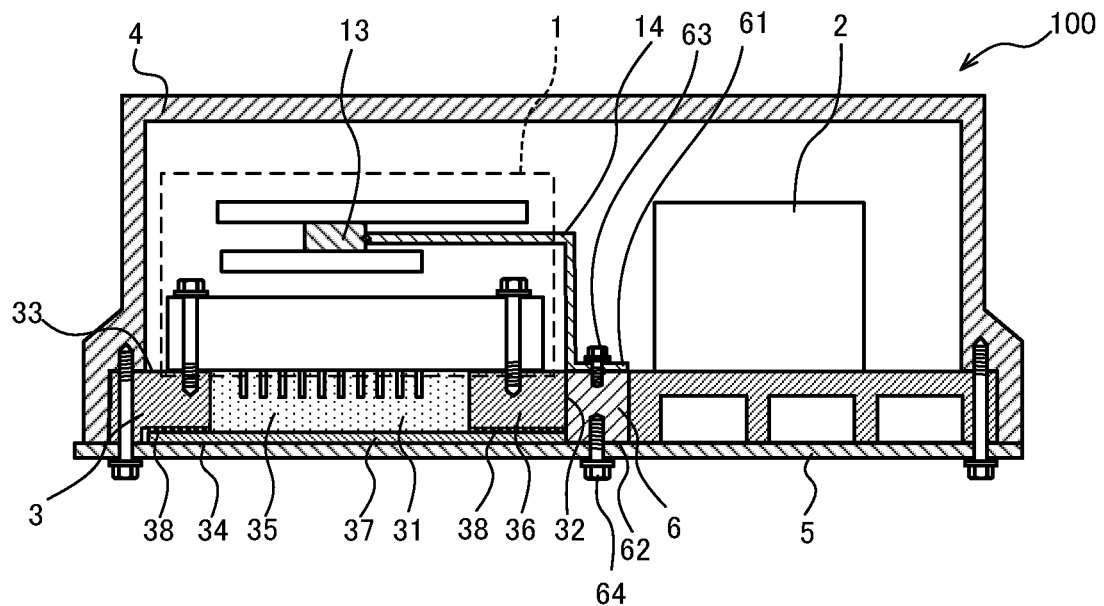
FIG. 6 is a schematic cross-sectional view of an electrical component housing according to a fifth embodiment.
Figure 7:
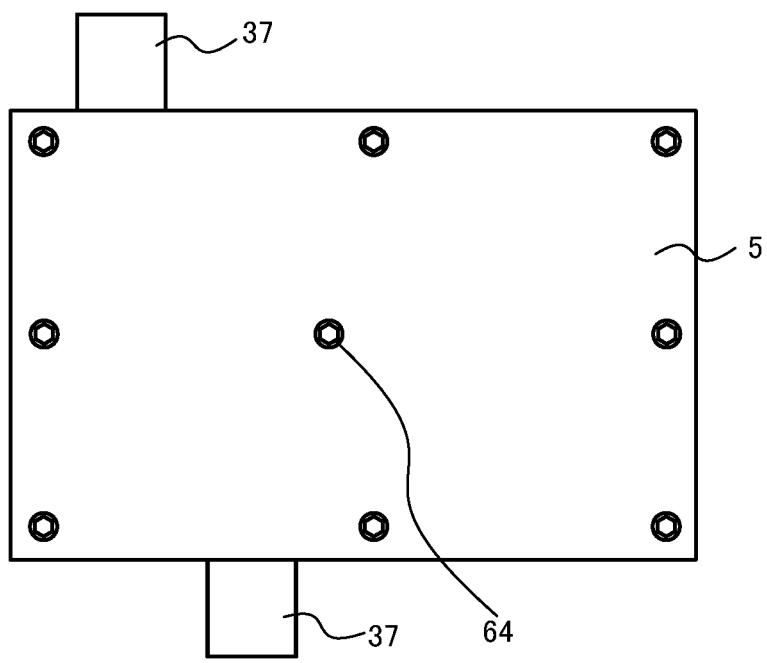
FIG. 7 is a bottom view of the electrical component housing according to the fifth embodiment.
Figure 8:
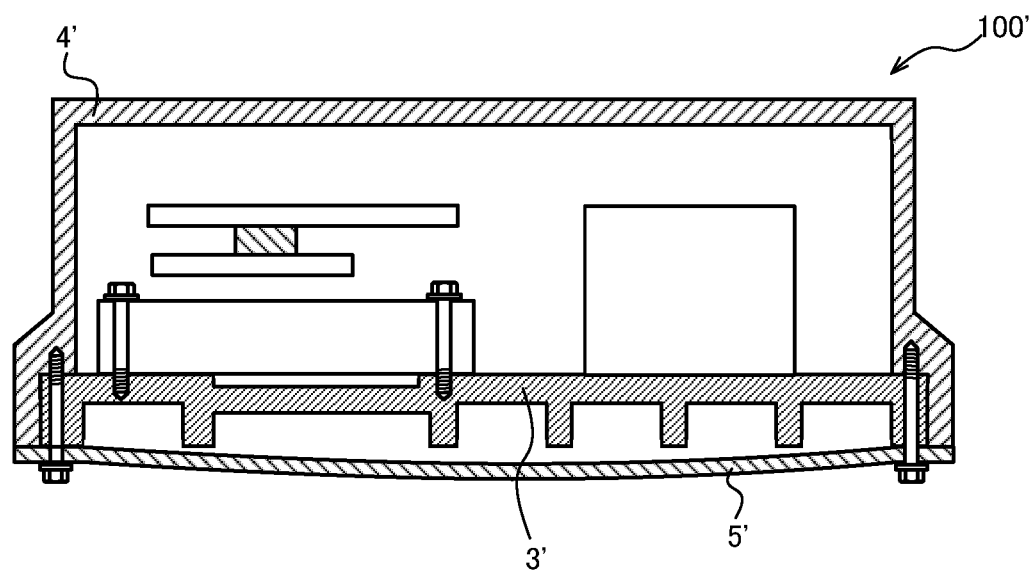
FIG. 8 is a diagram for explaining membrane vibration in an electrical component housing according to a comparative example.

FIG. 6 is a schematic cross-sectional view of the electrical component housing 100 according to the fifth embodiment, and FIG. 7 is a bottom view of the electrical component housing 100. In the present embodiment, the conductive member 6 is provided near a central portion of the electrical component housing 100.

As shown in FIG. 6, in the present embodiment, the ground terminal 13 of the inverter 1 and the metal plate 5 are also electrically connected via the conductive member 6 in the through hole 32 of the base portion 3 as in the other embodiments. The bottom surface 62 of the conductive member 6 is in contact with the upper surface of the metal plate 5, and the metal plate 5 is fixed to the bottom surface 62 of the conductive member 6 with the bolts 64 or the like.

The conductive member 6 is provided near the central portion of the electrical component housing 100, and as shown in FIG. 7, the conductive member 6 and the metal plate 5 are fastened from the metal plate 5 side with the bolts 64 or the like near the central portion of the electrical component housing 100. Note that a peripheral portion of the metal plate 5 is fastened together with the base portion 3 and the cover portion 4 with bolts or the like (FIGS. 6 and 7).

Here, in the electrical component housing, the metal plate covering the bottom surface of the base portion generally has low rigidity, and therefore when only the peripheral portion of the metal plate is fixed to the base portion, film vibration occurs in a central portion of the metal plate. For example, in an electrical component housing 100' shown in FIG. 8, a metal plate 5' is fixed to a base portion 3' and a cover portion 4' only at a peripheral portion of the metal plate 5', so that film vibration occurs in a central portion of the metal plate 5'. As a result, resonance occurs at low frequencies, and sound vibration performance of the electrical component housing 100' deteriorates.

Figure 9:
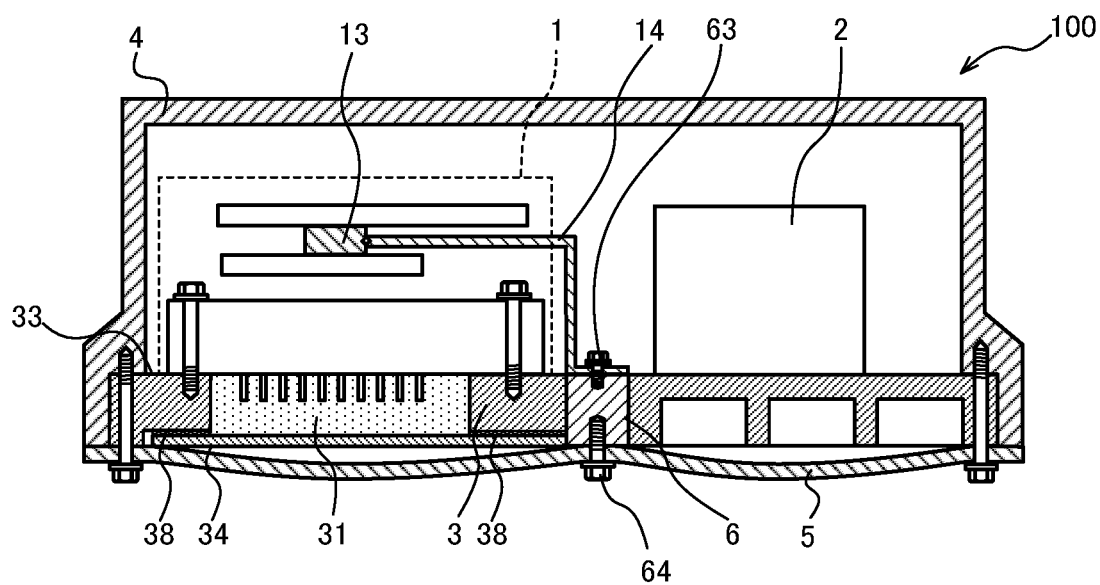
FIG. 9 is a diagram for explaining membrane vibration in the electrical component housing according to the fifth embodiment.

On the other hand, in the present embodiment, the metal plate 5 covering the bottom surface 34 of the base portion 3 is fixed to the base portion 3 and the cover portion 4 by bolts or the like at the peripheral portion, and the electrical component housing 100 is fixed to the conductive member 6 by bolts 64 or the like near the central portion thereof. Therefore, as shown in FIG. 9, resonance is suppressed even if the metal plate 5 vibrates, and deterioration of the sound vibration performance is suppressed.

Note that even when the conductive member 6 is not provided at a position near the central portion of the electrical component housing 100, as long as the metal plate 5 is fixed to the conductive member 6 with bolts or the like, the deterioration of the sound vibration performance can be suppressed to some extent. However, by disposing the conductive member 6 near the central portion of the electrical component housing 100 and fixing the metal plate 5 to the conductive member 6, it is possible to more effectively suppress the deterioration of the sound vibration performance.

According to the electrical component housing 100 according to the fifth embodiment described above, the following effects can be obtained.

In the electrical component housing 100, the conductive member 6 is provided near the central portion of the electrical component housing 100, and the metal plate 5 covering the bottom surface 34 of the base portion 3 is fixed to the conductive member 6. As a result, the metal plate 5 is fixed to the conductive member 6 near the central portion of the electrical component housing 100, so that even if the metal plate 5 vibrates, resonance is suppressed and deterioration of the sound vibration performance is suppressed.

Note that in any of the embodiments, the inverter 1 and the smoothing capacitor 2 are housed in the electrical component housing 100, but the electrical components housed in the electrical component housing 100 are not limited to these. The number of electrical components housed in the electrical component housing 100 is also optional, and may be, for example, one electrical component, or may be a plurality of electrical components.

In any of the embodiments, the ground terminal 13 of the inverter 1 and the conductive member 6 are electrically connected by the busbar 14, but the present invention is not limited thereto. For example, a wire harness or the like may be used as the conductor that connects the ground terminal 13 and the conductive member 6.

In any of the embodiments, cooling water is used as the coolant flowing through the coolant channel 31, but the coolant is not limited thereto, and may be, for example, coolant gas.

Although the embodiments of the present invention have been described above, the above embodiments are merely a part of application examples of the present invention and are not intended to limit the technical scope of the present invention to the specific configurations of the above embodiments.

Each of the embodiments described above has been described as a single embodiment, but may be appropriately combined.

The invention claimed is:

1. An electrical component housing for housing an electrical component, the electrical component housing comprising:
   a resin base portion allowing the electrical component to be mounted;
   a metal cover portion attached to the base portion and configured to cover the electrical component;
   a metal plate in contact with a bottom surface of the base portion in a manner of covering the bottom surface of the base portion; and
   a conductive member provided in a through hole that penetrates the base portion in a thickness direction of the base portion, wherein
   the conductive member electrically connects a ground terminal of the electrical component and the metal plate,
   the base portion includes a coolant channel allowing a coolant for cooling the electrical component to flow,
   the coolant channel passes below a position where the electrical component is mounted, and
   the conductive member is integrally fastened, directly below the electrical component, with the electrical component and a conductor connected to the ground terminal of the electrical component.

2. The electrical component housing according to claim 1, wherein
   the base portion includes a base body having an opening that opens downward, and a resin plate that is joined to the base body in a manner of covering the opening, the coolant channel is formed by sealing the opening with the resin plate, and
   a joint portion between the base body and the resin plate is formed along the coolant channel.

3. The electrical component housing according to claim 2, wherein
   the coolant channel below the electrical component is formed with a protruding portion protruding from an inner peripheral surface of the opening toward a center in a width direction of the coolant channel,
   the joint portion is formed on a lower surface of the protruding portion, and
   the conductive member is provided in the vicinity of the protruding portion.

4. The electrical component housing according to claim 2, wherein
   the conductive member is bent in a crank shape to avoid the joint portion in the vicinity of the coolant channel below the electrical component.

5. The electrical component housing according to claim 2, wherein
   the electrical component includes a fin configured to be in contact with the coolant in the coolant channel,
   a reinforcing member that crosses the coolant channel is erected upward from a bottom surface of the coolant channel in the coolant channel below the electrical component, and
   the reinforcing member is lower than the coolant channel so that the coolant passes through a tip of the reinforcing member.

6. The electrical component housing according to claim 1, wherein
   the conductive member is provided near a central portion of the electrical component housing, and
   the metal plate is fixed to the conductive member.

* * * * *